(12) United States Patent
Imai (10) Patent No.: US 7,518,452 B2
(45) Date of Patent: Apr. 14, 2009

(54) VOLTAGE-CONTROLLED CURRENT SOURCE AND VARIABLE-GAIN AMPLIFIER

(75) Inventor: Shigeo Imai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 11/677,773

(22) Filed: Feb. 22, 2007

(65) Prior Publication Data

US 2007/0205841 A1 Sep. 6, 2007

(30) Foreign Application Priority Data

Feb. 24, 2006 (JP) ............................. 2006-048778

(51) Int. Cl.
H03F 3/45 (2006.01)
(52) U.S. Cl. ..................... 330/254; 330/256; 330/289
(58) Field of Classification Search ................ 330/254, 330/256, 278, 279, 289
See application file for complete search history.

(56) References Cited

U.S. PATENT DOCUMENTS 6,717,469 B2 * 4/2004 Maruyama et al. .......... 330/254
6,724,235 B2 * 4/2004 Costa et al. .................. 330/254
6,819,183 B1 11/2004 Zhou et al.
7,009,449 B2 * 3/2006 Habring et al. ............. 330/254

FOREIGN PATENT DOCUMENTS

| JP | 2000-172353 | 6/2000 |
|---|---|---|
| JP | 2000-244250 | 9/2000 |
| JP | 2002-141753 | 5/2002 |

* cited by examiner

Primary Examiner—Khanh V Nguyen
(74) Attorney, Agent, or Firm—Amin, Turocy & Calvin, LLP (57) ABSTRACT

A voltage-controlled current source includes a current source having temperature dependency, a voltage source having process dependency, a first signal conversion circuit which generates second voltage having temperature dependency and process dependency by use of current of the current source and first voltage of the voltage source, a second signal conversion circuit which converts a first control signal used to control transfer conductance into a second control signal by using the second voltage as a reference, and a voltage-controlled current source circuit whose transfer conductance is controlled according to the second control signal.

20 Claims, 6 Drawing Sheets

VOLTAGE-CONTROLLED CURRENT SOURCE AND VARIABLE-GAIN AMPLIFIER

CROSS-REFERENCE TO RELATED APPLICATIONS

This application is based upon and claims the benefit of priority from prior Japanese Patent Application No. 2006-048778, filed Feb. 24, 2006, the entire contents of which are incorporated herein by reference.

BACKGROUND OF THE INVENTION

1. Field of the Invention

This invention relates to a voltage-controlled current source contained in a semiconductor integrated circuit and a variable-gain amplifier using the same and more particularly to a circuit which compensates for the temperature dependency and process dependency and is used in the semiconductor integrated circuit.

2. Description of the Related Art

Generally, in a voltage-controlled current source contained in a semiconductor integrated circuit and outputting a current corresponding to an input voltage, the transfer conductance Gm has temperature dependency and process dependency. When the voltage-controlled current source is used in an amplifier, Gm of the voltage-controlled current source varies depending on temperature variation and process fluctuation, and therefore, there occurs a problem that the gain of the amplifier will vary.

In the amplifier subjected to temperature compensation in Jpn. Pat. Appn. KOKAI Publication No. 2000-244250, it is disclosed that the temperature dependency of the gain thereof is eliminated. In the temperature compensation circuit and variable-gain amplifier circuit in Jpn. Pat. Appn. KOKAI Publication No. 2002-141753, it is disclosed that temperature variation in the gain characteristic of the variable-gain amplifier is suppressed. Further, in the constant voltage generation circuit in Jpn. Pat. Appn. KOKAI Publication No. 2000-172353, a circuit configuration which permits sufficiently low reference voltage to be generated is disclosed. However, since the reference potential of the output circuit of the constant voltage generation circuit is fixed, there occurs a possibility that output voltage will fluctuate if the reference potential varies.

BRIEF SUMMARY OF THE INVENTION

According to a first aspect of this invention, there is provided a voltage-controlled current source including a current source having temperature dependency, a voltage source having process dependency, a first signal conversion circuit which generates a second voltage having temperature dependency and process dependency by use of the current of the current source and a first voltage of the voltage source, a second signal conversion circuit which converts a first control signal used to control transfer conductance into a second control signal by using the second voltage as a reference, and a voltage-controlled current source circuit whose transfer conductance is controlled according to the second control signal.

According to a second aspect of this invention, there is provided a voltage-controlled current source including a voltage-controlled current source circuit, a control voltage generation circuit which generates a control voltage to control transfer conductance of the voltage-controlled current source circuit, and a reference voltage generation circuit which generates a voltage having temperature dependency and process dependency by use of current having temperature dependency and a voltage having process dependency and supplies the thus generated voltage to the voltage-controlled current source circuit as a reference voltage.

According to a third aspect of this invention, there is provided a variable-gain amplifier including a differential-type voltage-controlled current source which includes a current source having temperature dependency, a voltage source having process dependency, a first signal conversion circuit which generates a second voltage having temperature dependency and process dependency by use of the current of the current source and a first voltage of the voltage source, a second signal conversion circuit which converts a first control signal used to control transfer conductance into a second control signal by using the second voltage as a reference, and a voltage-controlled current source circuit whose transfer conductance is controlled according to the second control signal; and a load circuit connected to a differential current output node of the voltage-controlled current source.

DETAILED DESCRIPTION OF THE INVENTION

There will now be described embodiments of this invention with reference to the accompanying drawings. In this explanation, portions which are commonly used throughout the drawings are denoted by the same reference symbols.

Figure 1:
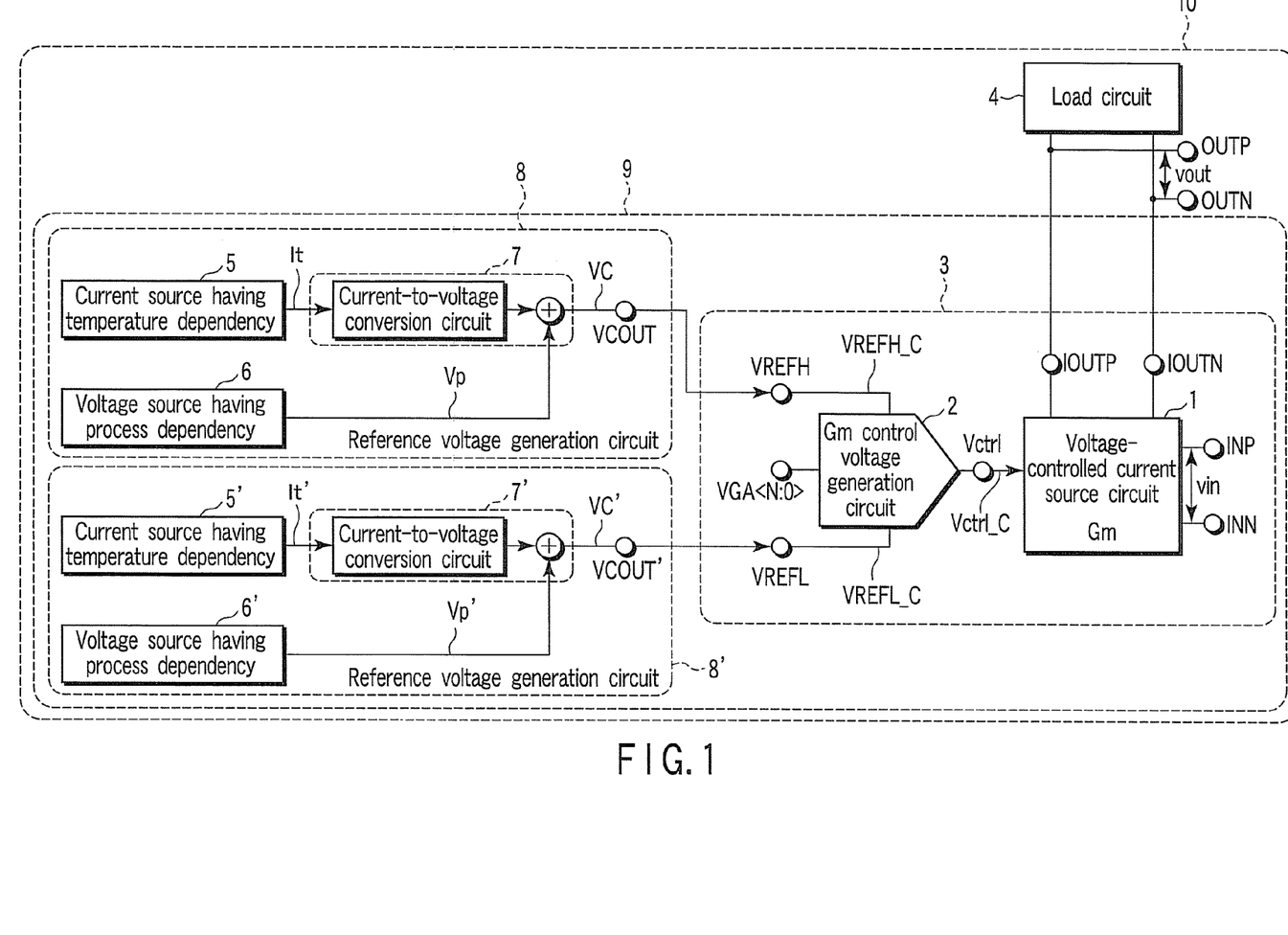
FIG. 1 is a block diagram showing the basic configuration of a voltage-controlled current source having a transfer conductance varying function according to an embodiment of this invention and a variable-gain amplifier using the same.

FIG. 1 is a block diagram showing the basic configuration of a voltage-controlled current source having a transfer conductance varying function according to one embodiment of this invention and a variable-gain amplifier using the same. A voltage-controlled current source circuit 1, a Gm control voltage generation circuit 2 which generates a Gm control voltage capable of changing the transfer conductance Gm of the voltage-controlled current source circuit 1 and reference voltage generation circuits 8, 8' are combined to configure a voltage-controlled current source 9. Further, a load circuit 4 is connected to the voltage-controlled current source circuit 1 of the voltage-controlled current source 9 to configure a variable-gain amplifier (VGA) 10.

The reference voltage generation circuit 8 combines a current having temperature dependency with a voltage having process dependency to generate a voltage VC having temperature dependency and process dependency. The voltage VC is supplied to the Gm control voltage generation circuit 2 as a high-potential-side reference voltage VREFH_C. Likewise, the reference voltage generation circuit 8' combines a current having temperature dependency with a voltage having process dependency to generate a voltage VC' having temperature dependency and process dependency. The voltage VC' is supplied to the Gm control voltage generation circuit 2 as a low-potential-side reference voltage VREFL_C.

The reference voltage generation circuit 8 includes a current source 5 having temperature dependency, a voltage source 6 having process dependency, and a signal conversion circuit 7 which generates a voltage VC having temperature dependency and process dependency by use of the current of the current source 5 and the voltage of the voltage source 6. The signal conversion circuit 7 includes a current-to-voltage conversion circuit which converts the current of the current source 5 into a voltage and a voltage adder which adds together the output voltage of the current-to-voltage conversion circuit and the output voltage of the voltage source 6 to generate the voltage VC.

Like the reference voltage generation circuit 8, the reference voltage generation circuit 8' includes a current source 5' having temperature dependency, a voltage source 6' having process dependency, and a signal conversion circuit 7' which generates a voltage VC' having temperature dependency and process dependency by use of the current of the current source 5' and the voltage of the voltage source 6'. The signal conversion circuit 7' includes a current-to-voltage conversion circuit which converts the current of the current source 5' into a voltage and a voltage adder which adds together the output voltage of the current-to-voltage conversion circuit and the output voltage of the voltage source 6' to generate the voltage VC'.

The Gm control voltage generation circuit 2 has one control signal input terminal VGA<N:0> to which a variable-gain signal used to control Gm of the voltage-controlled current source circuit 1 is input and two reference voltage input terminals VREFH, VREFL to which the high-potential-side reference voltage VREFH_C and low-potential-side reference voltage VREFL_C are respectively input. Thus, the reference voltages VREFH_C and VREFL_C can be independently controlled. Therefore, the Gm control voltage generation circuit 2 can function as a signal conversion circuit which converts a first control signal VGA<N:0> which is a variable-gain signal used to control Gm of the voltage-controlled current source circuit 1 into a control signal Vctrl_C by using the voltages VC, VC' of the reference voltage generation circuits 8, 8' as references.

The voltage-controlled current source circuit 1 uses a differential-type circuit and has differential input voltage terminals INP, INN, a control signal input terminal Vctrl and differential current output terminals IOUTP, IOUTN.

Figure 2:
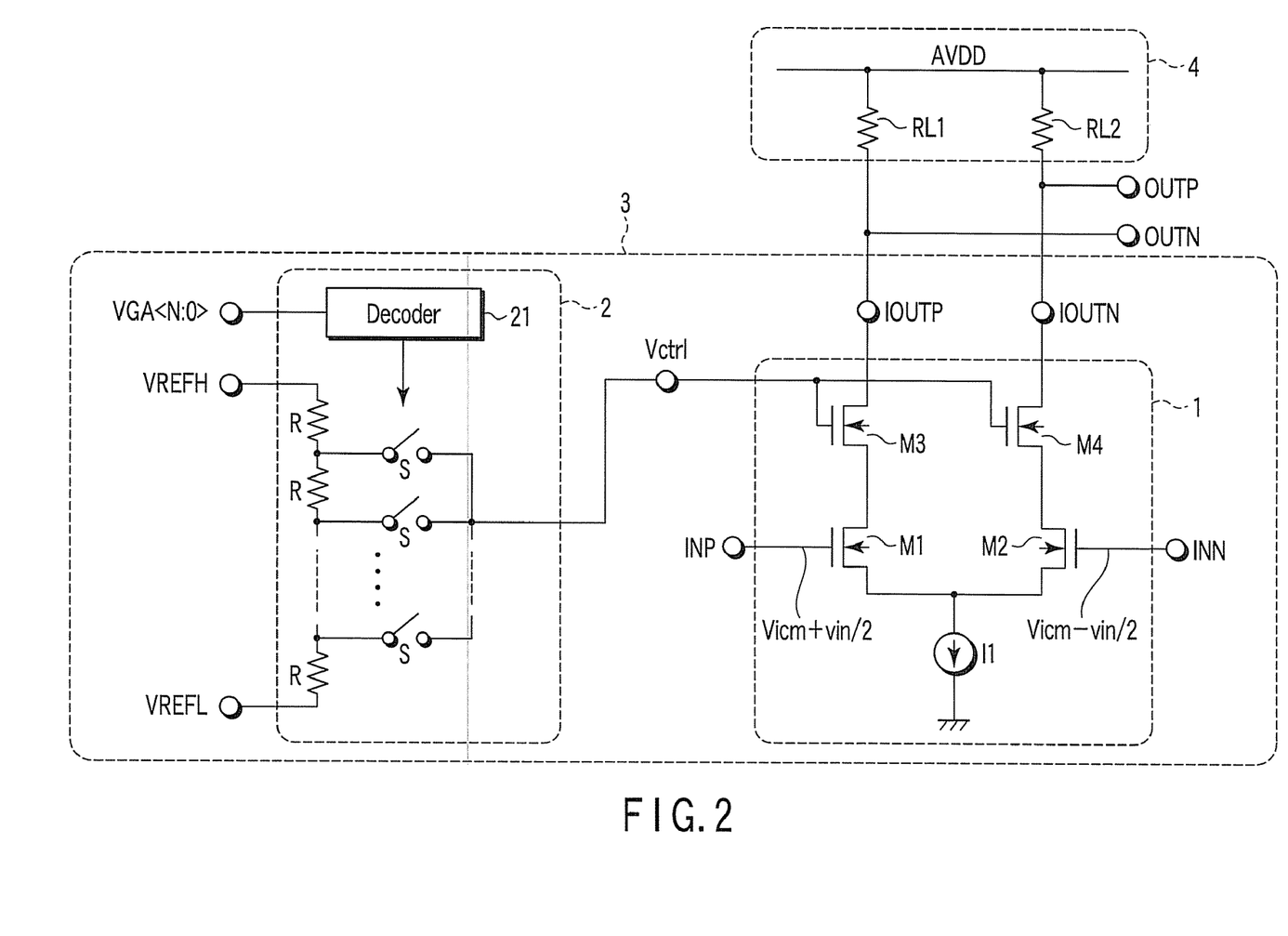
FIG. 2 is a circuit diagram showing a concrete example of a voltage-controlled current source circuit, Gm control voltage generation circuit and load circuit in the circuit shown in FIG. 1.

FIG. 2 is a circuit diagram showing a concrete example of the voltage-controlled current source circuit 1, Gm control voltage generation circuit 2 and load circuit 4 shown in FIG. 1. The Gm control voltage generation circuit 2 includes a decoder 21 which decodes a digital code input VGA<N:0> which is a gain control signal, N resistors R serially connected between the reference voltage input terminal VREFH to which the high-potential-side reference voltage VREFH_C is input and the reference voltage input terminal VREFL to which the low-potential-side reference voltage VREFL_C is input, and (N−1) switches S which are respectively connected at one-side ends to connection nodes of the N resistors R and commonly connected at the other ends to the output terminal of the Gm control voltage generation circuit 2 and is operated as a digital-to-analog converter. The voltage between the reference voltage input terminals VREFH and VREFL is divided by (2N+1) by use of the N resistors R and an analog voltage corresponding to the digital code input VGA<N:0> is output.

The voltage-controlled current source circuit 1 includes four MOS transistors M1 to M4 and one current source I1. The sources of the transistors M1, M2 are commonly connected to the current source I1 and a differential input signal INP of (Vicm+vin/2) and differential input signal INN of (Vicm−vin/2) are respectively input to the gates of the transistors M1, M2. Vicm indicates the gate bias voltage which sets the gate potentials of the transistors M1, M2 to always operate the transistors M1, M2 in the linear region. The drains of the transistors M1, M2 are respectively connected to the sources of the NMOS transistors M3, M4. The gates of the transistors M3, M4 are commonly connected to the output terminal of the Gm control voltage generation circuit 2 and the gate voltage Vctrl is supplied from the Gm control voltage generation circuit 2 to set the gate potentials of the transistors M3, M4 so as to always operate the transistors M3, M4 in the saturated region. The drains of the NMOS transistors M3, M4 are respectively connected to differential current output terminals IOUTP, IOUN.

In the load circuit 4, load resistors RL1, RL2 are respectively connected to the differential current output terminals IOUTP, IOUTN of the voltage-controlled current source circuit 1. The connection node of the load resistor RL1 and differential current output terminal IOUTP and the connection node of the load resistor RL2 and differential current output terminal IOUTN are respectively used as differential voltage output terminals OUTP, OUTN of the variable-gain amplifier (VGA) 10.

In the Gm control voltage generation circuit 2, voltages VC, VC' generated from the reference voltage generation circuits 8, 8' are input to the reference voltage input terminals VREFH, VREFL as reference voltages VREFH_C, VREFL_C to generate voltage Vctrl_C having temperature dependency and process dependency according to the first control signal VGA<N:0>. The Gm control voltage Vctrl_C having the temperature dependency and process dependency is input to the Gm control terminal Vctrl of the voltage-controlled current source circuit 1 to control Gm of the voltage-controlled current source circuit 1. In order to compensate for the temperature dependency and process dependency of Gm of the voltage-controlled current source circuit 1 according to the temperature dependency and process dependency of the Gm control voltage Vctrl_C, voltage VC used as the reference voltage VREFH_C is generated by adjusting current It of the current source 5 and voltage Vp of the voltage source 6 in the reference voltage generation circuit 8 by use of the signal conversion circuit 7 and voltage VC' used as the reference voltage VREFL_C is generated by adjusting current It' of the current source 5' and voltage Vp' of the voltage source 6' in the reference voltage generation circuit 8' by use of the signal conversion circuit 7'.

Now, attention is paid to the gain Av of the variable-gain amplifier (VGA) 10 shown in FIG. 1. If voltage between the differential voltage input terminals INP and INN of the voltage-controlled current source circuit 1 of the variable-gain amplifier 10 is set to vin, the resistance of each of the load resistors RL1, RL2 is set to RL and voltage between the differential voltage output terminals OUTP and OUTN is set to vout, then the following equations are obtained.

$$vout = -Gm \cdot RL \cdot vin \quad (1)$$

$$Av = vout/vin = -Gm \cdot RL \quad (2)$$

where Gm is determined according to control voltage (Vctrl_C), temperature (Temperature), process fluctuation (Vth variation) and the like and is expressed as follows.

$$Gm = f(Vctrl\_C; Temperature; Vth, etc) \quad (3)$$

It can be understood from the equation (3) that the gain Av has dependency on the control voltage (Vctrl_C), temperature and process.

Figure 3:
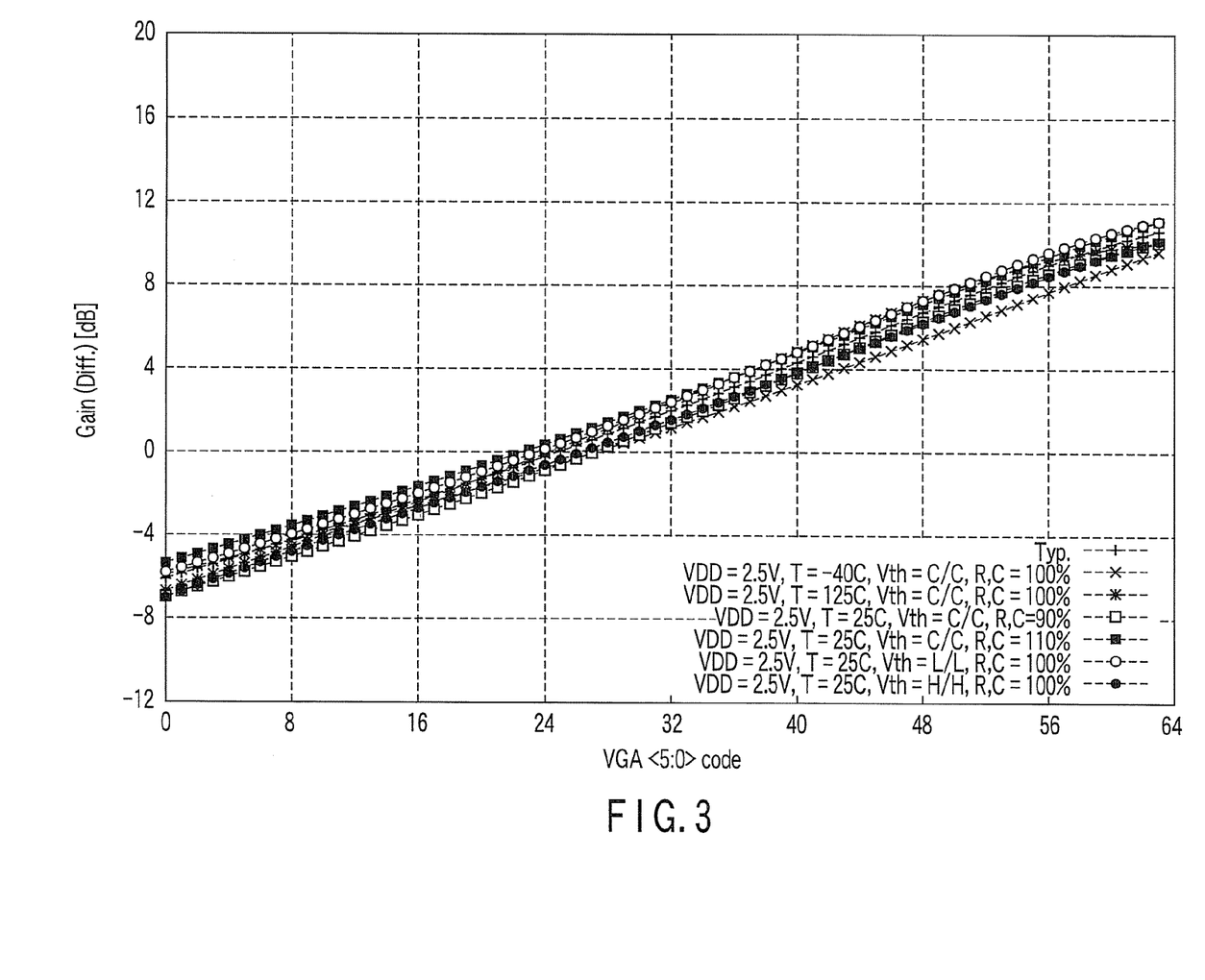
FIG. 3 is a characteristic diagram showing one example of the result obtained by simulating the characteristics of the variable-gain amplifier shown in FIG. 1.

FIG. 3 shows one example of the result obtained by simulating the characteristic of the variable-gain amplifier 10 shown in FIG. 1 by use of a circuit simulator. In FIG. 3, the abscissa indicates the digital code input VGA<N:0> (in this example, N=5) which is a gain control signal and the ordinate indicates a differential gain Gain(Diff) of the digital code input VGA. It can be understood from FIG. 3 that the variable-gain characteristic of the variable-gain amplifier 10 is stable even if the temperature, process, resistances are varied.

That is, according to the voltage-controlled current source 9 in the present embodiment, the temperature dependency and process dependency of Gm are compensated for and the stable Gm varying function which is less subject to the temperature dependency and process dependency can be attained. Further, according to the variable-gain amplifier 10 in the present embodiment, the temperature dependency and process dependency of the gain are compensated for and the gain characteristic which is stable with respect to the temperature variation and process fluctuation can be attained.

<First Concrete Example of First Current Sources 5, 5'>

Figure 4:
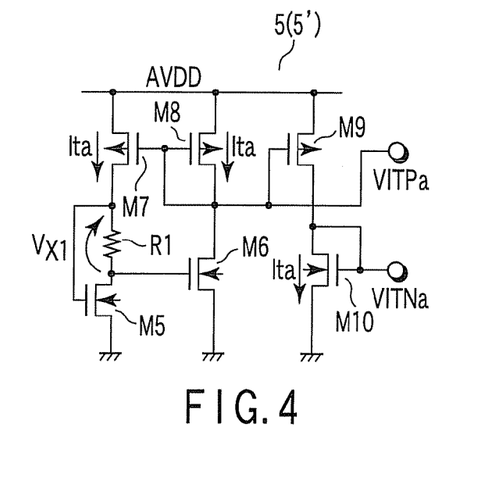
FIG. 4 is a circuit diagram showing a first concrete example of a current source having temperature dependency in the circuit shown in FIG. 1.

FIG. 4 is a circuit diagram showing a first concrete example of the current sources 5, 5' having the temperature dependency in the circuit of FIG. 1. The current source includes MOS transistors M5 to M10 and resistor R1. That is, the PMOS transistors M7, M9 are connected to the PMOS transistor M8 whose drain and gate are connected together to form a current mirror circuit. The resistor R1 and NMOS transistor M5 are serially connected to the PMOS transistor M7, the NMOS transistor M6 is serially connected to the PMOS transistor M8 and the NMOS transistor M10 is serially connected to the PMOS transistor M9. Further, the gate of the NMOS transistor M5 is connected to the source of the PMOS transistor M7 and the gate of the NMOS transistor M6 is connected to the drain of the NMOS transistor M5. The drain and gate of the NMOS transistor M10 are connected together. If the current mirror ratios of the PMOS transistors M7, M8, M9 are set equal to one another, the same currents Ita flow in all of the transistors of the current source of FIG. 4.

The W/L ratio (W: gate width, L: gate length) of the NMOS transistors M5, M6 is set to N:1, the transistors are operated in a weakly inverted region and voltage V×1 generated across the resistor R1 is expressed as follows. In this cae, all of the W/L ratios of the PMOS transistors M7, M8, M9 are set equal to one another.

$$V \times 1 = Vgs(M5) - Vgs(M6) = VT \cdot \ln(N) \quad (4)$$

where VT indicates thermal voltage and VT=k·T/q (k is a Boltzmann constant, T indicates temperature and q indicates an elementary charge amount).

If thermal voltage at preset temperature T0 is set to VT0 and a difference between the preset temperature T0 and ambient temperature T is set to ΔT, then VT=VT0(1+ΔT/T0) is attained and the current Ita can be expressed as follows.

$$\begin{aligned} Ita &= Vx1/R1 \\ &= VT \cdot \ln(N)/R1 \\ &= (VT0 \cdot \ln(N)/R1)(1 + \Delta T/T0) \end{aligned} \quad (5)$$

It can be understood from the equation (5) that the currents Ita flowing in the transistors M7, M8, M9 are increased with a temperature rise, and therefore, the current source of FIG. 4 has positive temperature dependency with respect to current.

<Second Concrete Example of First Current Sources 5, 5'>

Figure 5:
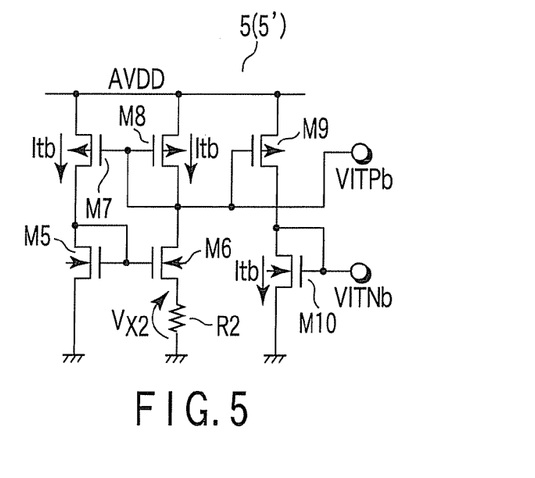
FIG. 5 is a circuit diagram showing a second concrete example of the current source having the temperature dependency in the circuit shown in FIG. 1.

FIG. 5 is a circuit diagram showing a second concrete example of the current sources 5, 5' having the temperature dependency in the circuit of FIG. 1. The current source is different from the current source explained with reference to FIG. 4 in that the resistor R1 is omitted, the drain and gate of the NMOS transistor M5 are connected together, the NMOS transistor M6 is connected to the NMOS transistor M5 to form a current mirror circuit and a resistor R2 is connected between the source of the NMOS transistor M6 and the ground node. The explanation for the principle of the operation of the current source is omitted, however, the current source is operated as a current source having positive temperature dependency like the current source explained with reference FIG. 4.

<Third Concrete Example of First Current Sources 5, 5'>

Figure 6:
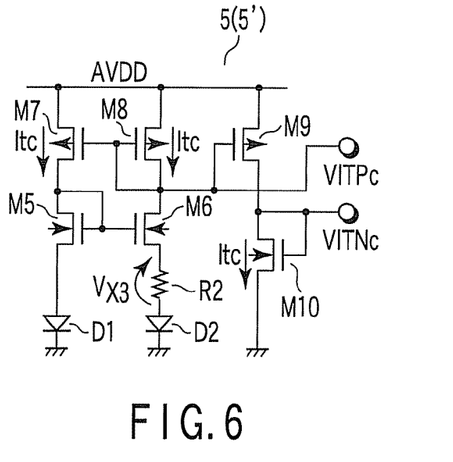
FIG. 6 is a circuit diagram showing a third concrete example of the current source having the temperature dependency in the circuit shown in FIG. 1.

FIG. 6 is a circuit diagram showing a third concrete example of the current sources 5, 5' having the temperature dependency in the circuit of FIG. 1. The current source is different from the current source explained with reference to FIG. 5 in that a diode D1 is connected in a forward direction between the source of the NMOS transistor M5 and the ground node and a diode D2 is connected in a forward direction between the other end of the resistor R2 which is connected at one end to the source of the NMOS transistor M6 and the ground node. The explanation for the principle of the operation of the current source is omitted, however, the current source is operated as a current source having positive temperature dependency like the current source described with reference to FIG. 4.

Figure 7:
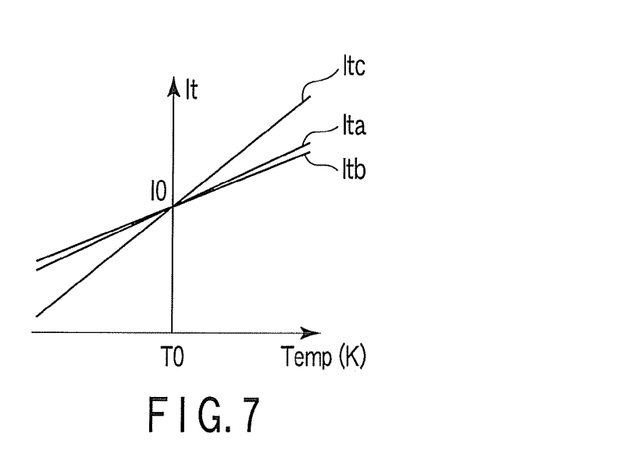
FIG. 7 is a characteristic diagram showing the temperature-current characteristics of the current sources shown in FIGS. 4, 5, 6.

FIG. 7 shows the temperature-current characteristics of the current sources shown in FIGS. 4 to 6. In this case, Ita indicates current flowing in the current source of FIG. 4, Itb indicates current flowing in the current source of FIG. 5 and Itc indicates current flowing in the current source of FIG. 6. Further, I0 indicates current flowing in the current source of FIG. 4 at preset temperature T0 and I0=VT0·ln(N)/R1 is obtained.

<First Concrete Example of First Voltage Sources 6, 6'>

Figure 8:
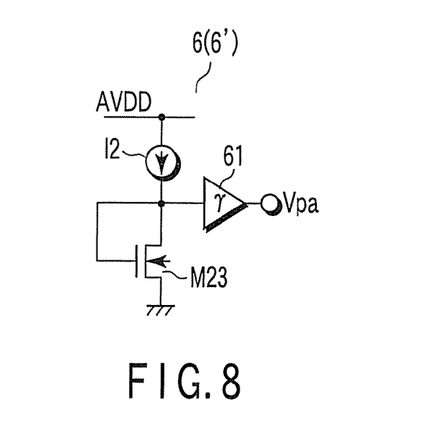
FIG. 8 is a circuit diagram showing a first concrete example of a voltage source having process dependency in the circuit shown in FIG. 1.

FIG. 8 is a circuit diagram showing a first concrete example of the voltage sources 6, 6' having the process dependency in the circuit of FIG. 1. The voltage source includes a MOS transistor M23, current source I2 and amplifier 61 having a gain γ. That is, the current source I2 and NMOS transistor M23 are serially connected and the drain and gate of the NMOS transistor M23 are connected together and connected to the input terminal of the amplifier 61.

As described above, the voltage source shown in FIG. 8 outputs first voltage Vpa having positive dependency on the process fluctuation (Vth variation) from the amplifier 61.

In the voltage sources 6, 6' shown in FIG. 8, if the threshold voltage at the manufacturing target center value is set to Vth0, the process fluctuation (for example, a difference amount) is set to Δth and the threshold voltage Vth is expressed as (Vth0+Δth), then the output voltage Vpa of the voltage sources 6, 6' is expressed as follows.

$$Vpa = \gamma \cdot (2 \cdot I2/\beta 23)^{1/2} + \gamma Vth \quad (6)$$
$$= \gamma \cdot (2 \cdot I2/\beta 23)^{1/2} + \gamma Vth0 + \gamma \Delta Vth$$
$$= Vpa0 + \gamma \Delta Vth$$

where $\beta 23$ is expressed by $(\mu n \cdot Cox \cdot W23)/L23$, $\mu n$ indicates the mobility of electrons, Cox indicates the gate oxide film thickness, W23 indicates the gate width of the transistor M23, and L23 indicates the gate length of the transistor M23. Since the current source I2 is set to output current having temperature dependency so as to compensate for the temperature dependency of β23, variation in the output voltage due to the temperature variation is neglected.

It can be understood from the equation (6) that when the process fluctuation ΔVth is set high with respect to the manufacturing target center value Vth0, the output voltage Vpa becomes higher accordingly and output, and therefore, the output voltage Vpa has positive process dependency (positive Vth dependency). That is, a voltage source having positive process dependency can be attained according to the voltage source shown in FIG. 8.

Figure 9:
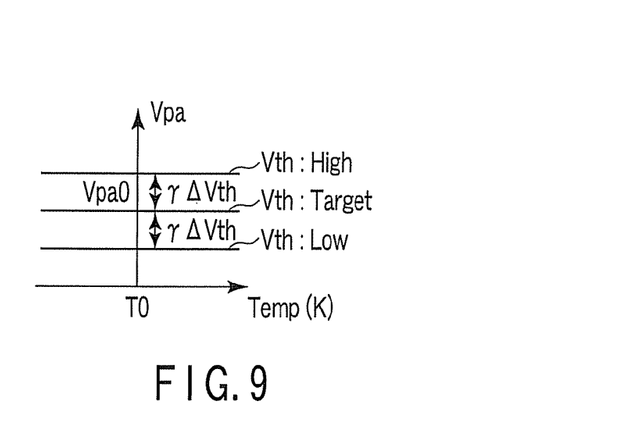
FIG. 9 is a characteristic diagram showing the temperature-output voltage characteristic of the voltage source shown in FIG. 8.

FIG. 9 shows the temperature-output voltage characteristic of the voltage source shown in FIG. 8. In this example, $Vpa0=\gamma \cdot (2 \cdot I2/\beta 23)^{1/2}+\gamma Vth0$ is set.

<Second Concrete Example of First Voltage Sources 6, 6'>

Figure 10:
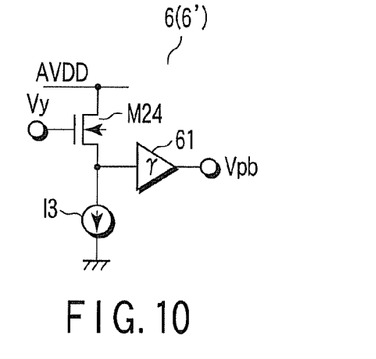
FIG. 10 is a circuit diagram showing a second concrete example of the voltage source having the process dependency in the circuit shown in FIG. 1.

FIG. 10 is a circuit diagram showing a second concrete example of the voltage sources 6, 6' having the process dependency in the circuit of FIGS. 1 and 2. The voltage source includes a MOS transistor M24, current source I3 and amplifier 61 of the gain γ. That is, the PMOS transistor M24 and current source I3 are serially connected and preset voltage Vy having no process dependency is input to the gate of the PMOS transistor M24. The connection node of the source of the PMOS transistor M24 and the current source I3 is connected to the input terminal of the amplifier 61.

As described above, the voltage source shown in FIG. 10 outputs first voltage Vpb having negative dependency with respect to process fluctuation (Vth variation) from the amplifier 61.

If the threshold voltage at the manufacturing target center value is set to Vth0, the process fluctuation (for example, a difference amount) is set to ΔVth and the threshold voltage Vth is expressed by (Vth0-ΔVth), the output voltage Vpb of the voltage source shown in FIG. 10 is expressed as follows.

$$Vpb = \gamma Vy - \gamma \cdot (2 \cdot I3/\beta 24)^{1/2} - \gamma Vth \quad (7)$$
$$= \gamma Vy - \gamma \cdot (2 \cdot I3/\beta 24)^{1/2} - \gamma Vth0 - \gamma \Delta Vth$$
$$= Vpb0 - \gamma \Delta Vth$$

where $\beta 24$ is expressed by $(\mu n \cdot Cox \cdot W24)/L24$, $\mu n$ indicates the mobility of electrons, Cox indicates the gate oxide film thickness, W24 indicates the gate width of the transistor M24, and L24 indicates the gate length of the transistor M24. Since the current source I3 is set to output current having temperature dependency so as to compensate for the temperature dependency of β24, variation in the output voltage due to the temperature variation is neglected.

It can be understood from the equation (7) that when the process fluctuation ΔVth is set high with respect to the manufacturing target center value Vth0, the output voltage Vpb becomes lower accordingly and output, and therefore, the output voltage Vpb has negative process dependency (negative Vth dependency). That is, a voltage source having negative process dependency can be attained according to the voltage source shown in FIG. 10.

Figure 11:
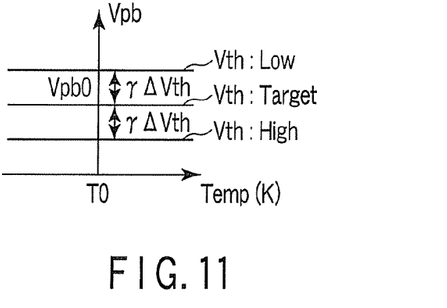
FIG. 11 is a characteristic diagram showing the temperature-output voltage characteristic of the voltage source shown in FIG. 10.

FIG. 11 shows the temperature-output voltage characteristic of the voltage source shown in FIG. 10. In this example, $Vpb0=\gamma Vy-\gamma \cdot (2 \cdot I3/\beta 24)^{1/2}-\gamma Vth0$ is set.

<First Concrete Example of First Signal Conversion Circuits 7, 7'>

Figure 12:
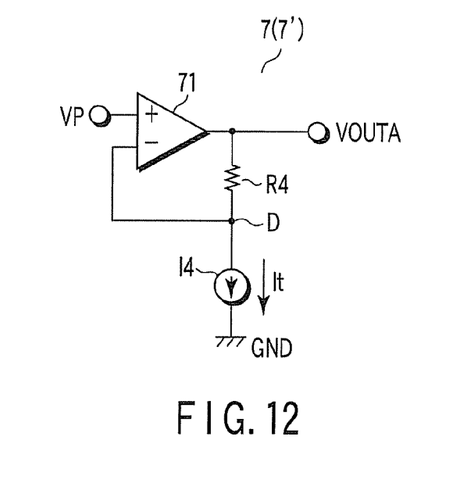
FIG. 12 is a circuit diagram showing a first concrete example of a current-to-voltage conversion circuit and voltage adder in a signal conversion circuit shown in FIG. 1.

FIG. 12 is a circuit diagram showing a first concrete example of a current-to-voltage conversion circuit and voltage adder in the signal conversion circuits 7, 7' of the circuit shown in FIG. 1. The signal conversion circuit includes an operational amplifier 71, resistor R4 and current source I4. That is, the resistor R4 is connected between the output terminal VOUTA of the operational amplifier 71 and the negative (−) input terminal D thereof and one end of the current source I4 is connected to the (−) input terminal D. With the above configuration, current It flows from the output terminal VOUTA of the operational amplifier 71 into the ground potential node GND via the resistor R4 and current source I4.

In the signal conversion circuit 7, 7' of FIG. 12, if voltage input to the positive (+) input terminal of the operational amplifier 71 is set as input voltage VP of the voltage adder and current flowing in the current source I4 is set as input current It of the current-to-voltage conversion circuit, the potential of the (−) input terminal D is set at substantially the same voltage as the input voltage VP due to the imaginary grounding characteristic of the operational amplifier. As a result, voltage obtained by adding an additional voltage component expressed by the product of the resistance R4 and the current It to a basic voltage component of VP appears on the output terminal VOUTA of the operational amplifier 71. That is, the voltage of the output terminal VOUTA is expressed as follows.

$$VOUTA = VP + R4 \cdot It \quad (8)$$

As described above, according to the signal conversion circuit shown in FIG. 12, a circuit which generates third voltage obtained by adding second voltage converted from the first input current by use of the resistor to the first input voltage can be attained.

<Second Concrete Example of First Signal Conversion Circuits 7, 7'>

Figure 13:
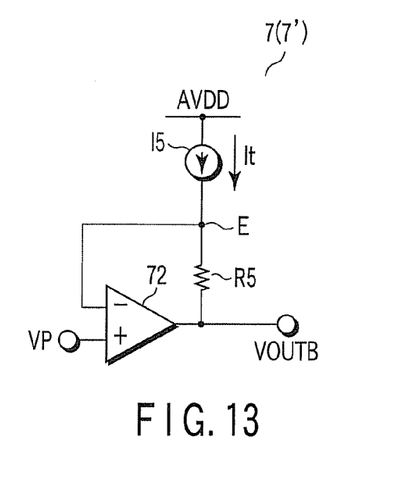
FIG. 13 is a circuit diagram showing a second concrete example of the current-to-voltage conversion circuit and voltage adder in the signal conversion circuit shown in FIG. 1.

FIG. 13 is a circuit diagram showing a second concrete example of the current-to-voltage conversion circuit and voltage adder in the signal conversion circuit 7, 7' of the circuit shown in FIG. 1. The signal conversion circuit includes an operational amplifier 72, resistor R5 and current source I5. That is, the resistor R5 is connected between the output terminal VOUTB of the operational amplifier 72 and the negative (−) input terminal E thereof and one end of the current source I5 is connected to the (−) input terminal E. With the above configuration, current It flows from a power supply AVDD into the output terminal VOUTB of the operational amplifier 72 via the resistor R5.

In the signal conversion circuit 7, 7' of FIG. 13, if voltage input to the positive (+) input terminal of the operational amplifier 72 is set as input voltage VP of the voltage adder and current flowing in the current source 15 is set as input current It of the current-to-voltage conversion circuit, the potential of the (−) input terminal E is set at substantially the same voltage as the input voltage VP due to the imaginary grounding characteristic of the operational amplifier. As a result, voltage obtained by subtracting an additional voltage component expressed by the product of the resistance R5 and the current It from a basic voltage component of VP appears on the output terminal VOUTB of the operational amplifier 72. That is, the voltage of the output terminal VOUTB is expressed as follows.

$$VOUTB = VP - R5 \cdot It \quad (9)$$

As described above, according to the signal conversion circuit shown in FIG. 13, a circuit which generates third voltage obtained by subtracting second voltage converted from the first input current by use of the resistor from the first input voltage can be attained.

<First Concrete Example of Reference Voltage Generation Circuit 8>

Figure 14:
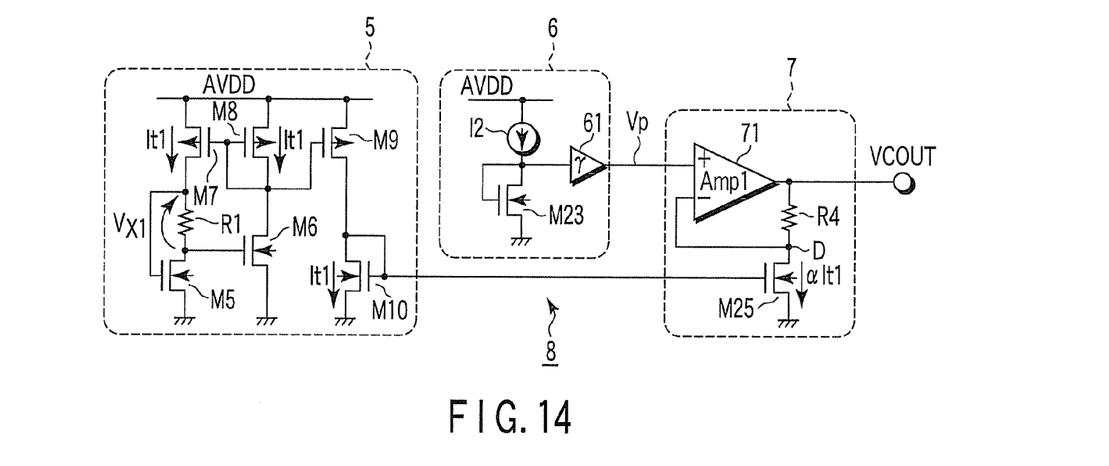
FIG. 14 is a circuit diagram showing a first concrete example of a reference voltage generation circuit shown in FIG. 1.
Figure 15:
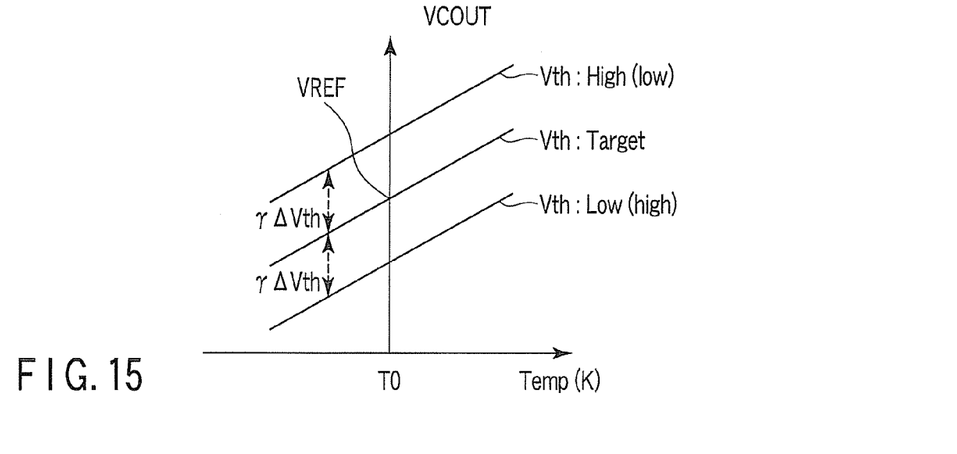
FIG. 15 is a characteristic diagram showing the temperature dependency and process dependency of output voltage of the reference voltage generation circuit shown in FIG. 14.

FIG. 14 is a circuit diagram showing a first concrete example of the reference voltage generation circuit 8 of the circuit shown in FIG. 1. FIG. 15 shows the temperature dependency and process dependency of output voltage VCOUT of the reference voltage generation circuit 8 shown in FIG. 14. In the reference voltage generation circuit 8 of FIG. 14, any one of the current sources explained with reference to FIGS. 4, 5, 6 can be used as a current source 5 having temperature dependency. In the reference voltage generation circuit 8 of FIG. 14, the current source explained with reference to FIG. 4 is used. In the reference voltage generation circuit 8 of FIG. 14, the voltage source having the positive process dependency and explained with reference to FIG. 8 or the voltage source having the negative process dependency and explained with reference to FIG. 10 can be used as a voltage source 6 having process dependency. In the reference voltage generation circuit 8 of FIG. 14, the voltage source having the positive process dependency and explained with reference to FIG. 8 is used. In the reference voltage generation circuit 8 of FIG. 14, the signal conversion circuit explained with reference to FIG. 12 is used as a signal conversion circuit (current-to-voltage conversion circuit and voltage adder) 7.

In this case, an NMOS transistor M25 which corresponds to the current source I4 in the signal conversion circuit shown in FIG. 12 is used, the gate of the transistor M25 is connected to the gate of a transistor M10 of the current source 5 and thus the transistors M10 and M25 are combined to configure a current mirror circuit. The current mirror ratio of the current mirror circuit is set to 1:α. Therefore, current αIt1 equal to the current It1 having temperature dependency and flowing in the transistor M10 multiplied by α flows in the transistor M25.

The output voltage VCOUT of the reference voltage generation circuit 8 with the above configuration can be derived according to the equations (5), (6), (7) as follows.

$$It1 = VT \cdot \ln(N)/R1 \quad (10)$$
$$= (VT0 \cdot \ln(N)/R1) \cdot (1 + \Delta T/T0)$$

$$VP = Vpa0 \pm \gamma \Delta Vth \quad (11)$$
$$VCOUT = VP + R4 \cdot \alpha It1$$
$$= Vpa0 + \alpha VT0 \cdot \ln(N) \cdot R4/R1$$

$$+(\alpha VT0 \cdot \ln(N) \cdot R4/R1) \cdot (\Delta T/T0) \pm \gamma \Delta Vth \quad (12)$$

The item of (Vpa0+αVT0·In(N)·R4/R1) in the equation (12) expresses the reference voltage VREF, the item of +(αVT0·In(N)·R4/R1)(ΔT/T0) expresses the positive temperature dependency and the item of ±γΔVth expresses the positive or negative process dependency. That is, the equation (12) indicates that the output voltage VCOUT of the reference voltage generation circuit 8 contains a basic voltage component of the reference voltage VREF, an additional voltage component exhibiting the positive temperature dependency and an additional voltage component exhibiting the positive or negative process dependency. Further, as shown in the equation (12), the output voltage VCOUT contains the resistance ratio R4/R1 of the two resistors R1, R4, however, the resistance ratio of the paired resistors can be attained at high precision in the semiconductor process, and therefore, R4/R1 is difficult to be influenced by the manufacturing variation of the resistances.

As described above, according to the reference voltage generation circuit 8 shown in FIG. 14, the output voltage VCOUT which contains a basic voltage component of preset voltage, an additional voltage component exhibiting the positive temperature dependency and an additional voltage component exhibiting the positive process dependency can be attained as shown in FIG. 15. In the reference voltage generation circuit 8 shown in FIG. 14, the voltage source having the positive process dependency and explained with reference to FIG. 8 is used as the voltage source 6 having the process dependency, however, when the voltage source having the negative process dependency and explained with reference to FIG. 10 is used instead of the above voltage source, the voltage VCOUT comes to have the negative process dependency as shown by (Low), (High) in FIG. 15.

<Second Concrete Example of Reference Voltage Generation Circuit 8>

Figure 16:
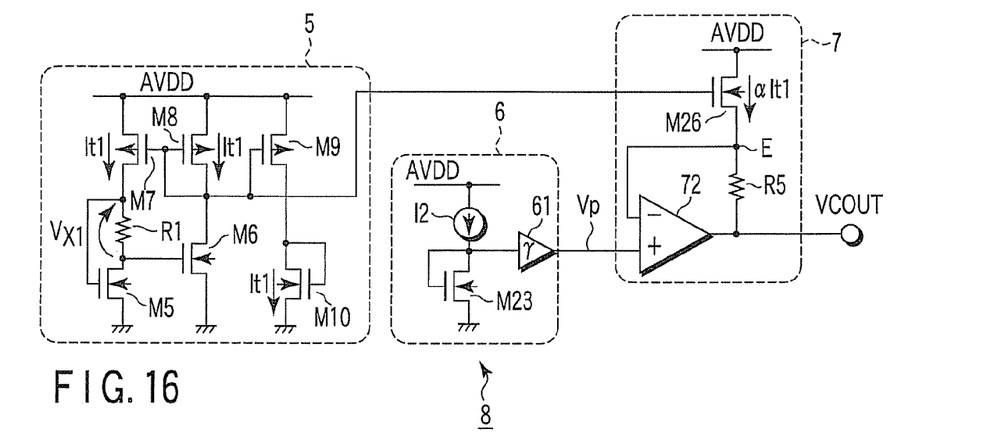
FIG. 16 is a circuit diagram showing a second concrete example of the reference voltage generation circuit shown in FIG. 1.
Figure 17:
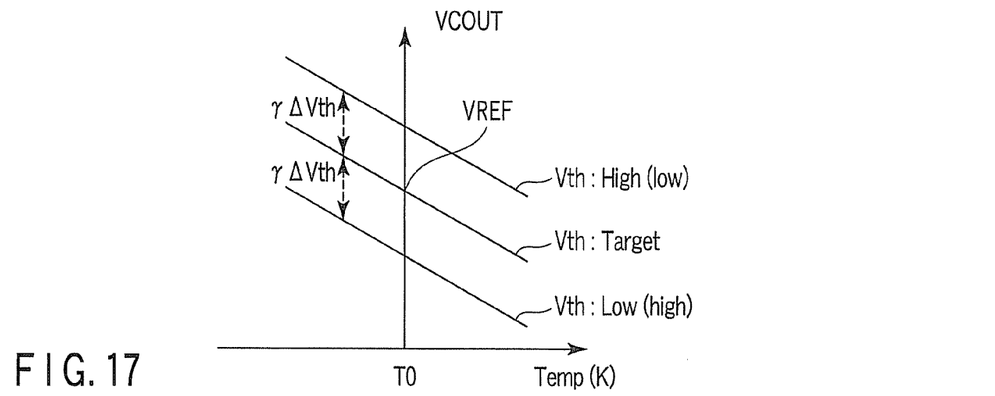
FIG. 17 is a characteristic diagram showing the temperature dependency and process dependency of output voltage of the reference voltage generation circuit shown in FIG. 16.

FIG. 16 is a circuit diagram showing a second concrete example of the reference voltage generation circuit 8 of the circuit shown in FIG. 1. FIG. 17 shows the temperature dependency and process dependency of the output voltage VCOUT of the reference voltage generation circuit 8 shown in FIG. 16. In the reference voltage generation circuit 8 of FIG. 16, any one of the current sources explained with reference to FIGS. 4, 5, 6 can be used as a current source 5 having temperature dependency, however, in the reference voltage generation circuit 8 of FIG. 16, the current source explained with reference to FIG. 4 is used. In the reference voltage generation circuit 8 of FIG. 16, the voltage source having the positive process dependency and explained with reference to FIG. 8 or the voltage source having the negative process dependency and explained with reference to FIG. 10 can be used as a voltage source 6 having process dependency. However, in the reference voltage generation circuit 8 of FIG. 16, the voltage source having the positive process dependency and explained with reference to FIG. 8 is used. In the reference voltage generation circuit 8 of FIG. 16, the signal conversion circuit explained with reference to FIG. 13 is used as a signal conversion circuit (current-to-voltage conversion circuit and voltage adder) 7.

In this case, a PMOS transistor M26 which corresponds to the current source I5 in the signal conversion circuit 7 shown in FIG. 13 is used and the gate of the transistor M26 is connected to the gate of a transistor M8 of the current source 5 to configure a current mirror circuit. The current mirror ratio of the transistors M8 and M26 is set to 1:α. Therefore, current αIt1 equal to the current It1 having temperature dependency and flowing in the transistor M8 multiplied by α flows in the transistor M26.

The output voltage VCOUT of the reference voltage generation circuit 8 with the above configuration can be derived according to the equation (12) as follows.

$$VCOUT = VP \quad (13)$$
$$= R5 \cdot \alpha It1$$
$$= Vpb0 + \alpha VT0 \cdot \ln(N) \cdot R5/R1 -$$
$$(\alpha VT0 \cdot \ln(N) \cdot R5/R1) \cdot (\Delta T/T0) \pm \gamma \Delta Vth$$

In the above equation (13), the item of (Vpb0+αVT0·ln(N)·R5/R1) expresses the reference voltage VREF, the item of −(αVT0·ln(N)·R5/R1)(ΔT/T0) expresses the negative temperature dependency and the item of ±γΔVth expresses the positive or negative process dependency. That is, the equation (13) indicates that the output voltage VCOUT of the reference voltage generation circuit 8 contains a basic voltage component of the reference voltage VREF, an additional voltage component exhibiting the negative temperature dependency and an additional voltage component exhibiting the positive or negative process dependency. Further, as shown in the equation (13), the output voltage VCOUT contains the resistance ratio R5/R1 of the two resistors R1, R5, however, the resistance ratio of the paired resistors can be attained at high precision in the semiconductor process, and therefore, R5/R1 is difficult to be influenced by the manufacturing variation in the resistance.

As described above, according to the reference voltage generation circuit 8 shown in FIG. 16, the output voltage VCOUT which contains a basic voltage component of preset voltage, an additional voltage component exhibiting the negative temperature dependency and an additional voltage component exhibiting the positive process dependency can be generated as shown in FIG. 17. In the reference voltage generation circuit 8 shown in FIG. 16, the voltage source having the positive process dependency and explained with reference to FIG. 8 is used as the voltage source 6 having the process dependency, however, when the voltage source having the negative process dependency and explained with reference to FIG. 10 is used instead of the above voltage source, the voltage VCOUT comes to have the negative process dependency as shown by (Low), (High) in FIG. 17.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage-controlled current source comprising:
a current source having temperature dependency,
a voltage source having process dependency,
a first signal conversion circuit which generates second voltage having temperature dependency and process dependency by use of current of the current source and first voltage of the voltage source,
a second signal conversion circuit which converts a first control signal used to control transfer conductance into a second control signal by using the second voltage as a reference, and
a voltage-controlled current source circuit whose transfer conductance is controlled according to the second control signal.

2. The voltage-controlled current source according to claim 1, wherein the current source having the temperature dependency generates the current having positive temperature dependency, the voltage source generates the first voltage having one of positive and negative process dependencies, and the first signal conversion circuit converts current depending on the current of the current source having the temperature dependency into voltage by use of a resistor and adds the converted voltage to the first voltage of the voltage source to generate the second voltage having positive temperature dependency and one of positive and negative process dependencies.

3. The voltage-controlled current source according to claim 2, wherein the current source having the temperature dependency includes a first MOS transistor in which the current having the positive temperature dependency flows, the voltage source has an amplifier with gain γ provided at an output stage thereof, the first signal conversion circuit includes an operational amplifier having a positive input terminal supplied with output voltage of the voltage source and a negative input terminal and output terminal between which the resistor having resistance r is connected and a second MOS transistor which is inserted between the negative input terminal of the operational amplifier and a ground potential node and connected to the first MOS transistor to form a current mirror and in which current equal to the current of the first MOS transistor multiplied by magnification α flows, and a characteristic of the second voltage of the first signal conversion circuit is controlled by changing values of the gain γ, magnification α and resistance r.

4. The voltage-controlled current source according to claim 1, wherein the current source having the temperature dependency generates the current having positive temperature dependency, the voltage source generates the first voltage having one of positive and negative process dependencies, and the first signal conversion circuit converts current depending on the current of the current source having the temperature dependency into voltage by use of a resistor and subtracts the converted voltage from the first voltage of the voltage source to generate the second voltage having negative temperature dependency and one of positive and negative process dependencies.

5. The voltage-controlled current source according to claim 4, wherein the current source having the temperature dependency includes a first MOS transistor in which the current having the positive temperature dependency flows, the voltage source has an amplifier with gain γ provided at an output stage thereof, the first signal conversion circuit includes an operational amplifier having a positive input terminal supplied with output voltage of the voltage source and a negative input terminal and output terminal between which the resistor having resistance r is connected and a second MOS transistor which is inserted between the negative input terminal of the operational amplifier and a power supply potential node and connected to the first MOS transistor to form a current mirror and in which current equal to the current of the first MOS transistor multiplied by magnification a flows, and a characteristic of the second voltage of the first signal conversion circuit is controlled by changing values of the gain γ, magnification α and resistance r.

6. The voltage-controlled current source according to claim 1, wherein the second signal conversion circuit has reference voltage input terminals on high-potential and low-potential sides, and the first signal conversion circuit includes one first signal conversion circuit for the reference voltage terminal on the high-potential side of the second signal conversion circuit and one first signal conversion circuit for the reference voltage terminal on the low-potential side thereof and the second voltages respectively generated from the first signal conversion circuits are independently input to the reference voltage input terminals on the high-potential and low-potential sides of the second signal conversion circuit.

7. A voltage-controlled current source comprising:
a voltage-controlled current source circuit,
a control voltage generation circuit which generates control voltage to control transfer conductance of the voltage-controlled current source circuit, and
a reference voltage generation circuit which generates voltage having temperature dependency and process dependency by use of current having temperature dependency and voltage having process dependency and supplies the generated voltage to the voltage-controlled current source circuit as a reference voltage.

8. The voltage-controlled current source according to claim 7, wherein the reference voltage generation circuit includes a current source having temperature dependency, a voltage source having process dependency and a first signal conversion circuit which generates a second voltage having temperature dependency and process dependency by use of current of the current source and first voltage of the voltage source, the control voltage generation circuit includes a second signal conversion circuit which converts a first control signal used to control transfer conductance into a second control signal by using the second voltage as a reference, and the voltage-controlled current source circuit includes a current source circuit whose transfer conductance is controlled according to the second control signal.

9. The voltage-controlled current source according to claim 8, wherein the current source having the temperature dependency generates the current having positive temperature dependency, the voltage source generates the first voltage having one of positive and negative process dependencies, and the first signal conversion circuit converts current depending on the current of the current source having the temperature dependency into voltage by use of a resistor and adds the converted voltage to the first voltage of the voltage source to generate the second voltage having positive temperature dependency and one of positive and negative process dependencies.

10. The voltage-controlled current source according to claim 9, wherein the current source having the temperature dependency includes a first MOS transistor in which the current having the positive temperature dependency flows, the voltage source includes an amplifier with gain γ provided at an output stage thereof, the first signal conversion circuit includes an operational amplifier having a positive input terminal supplied with output voltage of the voltage source and a negative input terminal and output terminal between which the resistor having resistance r is connected and a second MOS transistor which is inserted between the negative input terminal of the operational amplifier and a ground potential node and connected to the first MOS transistor to form a current mirror and in which current equal to the current of the first MOS transistor multiplied by magnification a flows, and a characteristic of the second voltage of the first signal conversion circuit is controlled by changing values of the gain γ, magnification α and resistance r.

11. The voltage-controlled current source according to claim 8, wherein the current source having the temperature dependency generates the current having positive temperature dependency, the voltage source generates the first voltage having one of positive and negative process dependencies, and the first signal conversion circuit converts current depending on the current of the current source having the temperature dependency into voltage by use of a resistor and subtracts the converted voltage from the first voltage of the voltage source to generate the second voltage having negative temperature dependency and one of positive and negative process dependencies.

12. The voltage-controlled current source according to claim 11, wherein the current source of the reference voltage generation circuit includes a first MOS transistor in which the current having the positive temperature dependency flows, the voltage source includes an amplifier with gain γ provided at an output stage thereof, the first signal conversion circuit includes an operational amplifier having a positive input terminal supplied with output voltage of the voltage source and a negative input terminal and output terminal between which the resistor having resistance r is connected and a second MOS transistor which is inserted between the negative input terminal of the operational amplifier and a power supply potential node and connected to the first MOS transistor to form a current mirror and in which current equal to the current of the first MOS transistor multiplied by magnification a flows, and a characteristic of the second voltage of the first signal conversion circuit is controlled by changing values of the gain γ, magnification α and resistance r.

13. The voltage-controlled current source according to claim 8, wherein the second signal conversion circuit has reference voltage input terminals on high-potential and low-potential sides, and the first signal conversion circuit includes one first signal conversion circuit for the reference voltage terminal on the high-potential side of the second signal conversion circuit and one first signal conversion circuit for the reference voltage terminal on the low-potential side thereof and the second voltages respectively generated from the first signal conversion circuits are independently input to the reference voltage input terminals on the high-potential and low-potential sides of the second signal conversion circuit.

14. A variable-gain amplifier comprising:
a differential-type voltage-controlled current source which includes a current source having temperature dependency, a voltage source having process dependency, a first signal conversion circuit which generates second voltage having temperature dependency and process dependency by use of current of the current source and first voltage of the voltage source, a second signal conversion circuit which converts a first control signal used to control transfer conductance into a second control signal by using the second voltage as a reference and a voltage-controlled current source circuit whose transfer conductance is controlled according to the second control signal; and a load circuit connected to a differential current output node of the voltage-controlled current source.

15. The variable-gain amplifier according to claim 14, wherein the current source having the temperature dependency generates the current having positive temperature dependency, the voltage source generates the first voltage having one of positive and negative process dependencies, and the first signal conversion circuit converts current depending on the current of the current source having the temperature dependency into voltage by use of a resistor and adds the converted voltage to the first voltage of the voltage source to generate the second voltage having positive temperature dependency and one of positive and negative process dependencies.

16. The variable-gain amplifier according to claim 15, wherein the current source having the temperature dependency includes a first MOS transistor in which the current having the positive temperature dependency flows, the voltage source includes an amplifier with gain γ provided at an output stage thereof, the first signal conversion circuit includes an operational amplifier having a positive input terminal supplied with output voltage of the voltage source and a negative input terminal and output terminal between which the resistor having resistance r is connected and a second MOS transistor which is inserted between the negative input terminal of the operational amplifier and a ground potential node and connected to the first MOS transistor to form a current mirror and in which current equal to the current of the first MOS transistor multiplied by magnification a flows, and a characteristic of the second voltage of the first signal conversion circuit is controlled by changing values of the gain γ, magnification α and resistance r.

17. The variable-gain amplifier according to claim 14, wherein the current source having the temperature dependency generates the current having positive temperature dependency, the voltage source generates the first voltage having one of positive and negative process dependencies, and the first signal conversion circuit converts current depending on the current of the current source having the temperature dependency into voltage by use of a resistor and subtracts the converted voltage from the first voltage of the voltage source to generate the second voltage having negative temperature dependency and one of positive and negative process dependencies.

18. The variable-gain amplifier according to claim 17, wherein the current source having the temperature dependency includes a first MOS transistor in which the current having the positive temperature dependency flows, the voltage source includes an amplifier with gain γ provided at an output stage thereof, the first signal conversion circuit includes an operational amplifier having a positive input terminal supplied with output voltage of the voltage source and a negative input terminal and output terminal between which the resistor having resistance r is connected and a second MOS transistor which is inserted between the negative input terminal of the operational amplifier and a power supply potential node and connected to the first MOS transistor to form a current mirror and in which current equal to the current of the first MOS transistor multiplied by magnification .alpha. flows, and a characteristic of the second voltage of the first signal conversion circuit is controlled by changing values of the gain γ, magnification α and resistance r.

19. The variable-gain amplifier according to claim 14, wherein the second signal conversion circuit has reference voltage input terminals on high-potential and low-potential sides, and the first signal conversion circuit includes one first signal conversion circuit for the reference voltage terminal on the high-potential side of the second signal conversion circuit and one first signal conversion circuit for the reference voltage terminal on the low-potential side thereof and the second voltages respectively generated from the first signal conversion circuits are independently input to the reference voltage input terminals on the high-potential and low-potential sides of the second signal conversion circuit.

20. A variable-gain amplifier comprising:

a differential voltage-controlled current source used as the voltage-controlled current source according to claim 7, and a load circuit connected to a differential current output node of the differential voltage-controlled current source.

* * * * *